(12) United States Patent
Kim et al.

(10) Patent No.: US 8,383,431 B2
(45) Date of Patent: Feb. 26, 2013

(54) ORGANIC LIGHT-EMITTING DIODE AND METHOD OF MANUFACTURING THE SAME

(75) Inventors: Won-Jong Kim, Yongin (KR); Chang-Ho Lee, Yongin (KR); Jong-Hyuk Lee, Yongin (KR); Young-Woo Song, Yongin (KR); Yong-Tak Kim, Yongin (KR); Jin-Baek Choi, Yongin (KR); Joon-Gu Lee, Yongin (KR); Se-Jin Cho, Yongin (KR); Hee-Joo Ko, Yongin (KR); Il-Soo Oh, Yongin (KR); Hye-Lim Lee, Yongin (KR); Kyu-Hawn Hwang, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 297 days.

(21) Appl. No.: 12/701,836

(22) Filed: Feb. 8, 2010

(65) Prior Publication Data

US 2010/0207149 A1    Aug. 19, 2010

(30) Foreign Application Priority Data

Feb. 17, 2009    (KR) .......................... 10-2009-0013126

(51) Int. Cl.
*H01L 21/00*    (2006.01)

(52) U.S. Cl. ............... 438/29; 438/22; 438/48; 438/99; 438/153; 257/40; 257/72; 257/E27.111; 313/500; 313/503; 313/504; 313/506

(58) Field of Classification Search ..................... None
See application file for complete search history.

(56) References Cited

U.S. PATENT DOCUMENTS 7,102,282 B1 *   9/2006   Yamada et al. ............... 313/506
7,750,554 B2     7/2010   Shin
(Continued)

FOREIGN PATENT DOCUMENTS

JP    05-114482       5/1993
JP    2005-302313     10/2005
(Continued)

OTHER PUBLICATIONS

KIPO Office action dated Jan. 27, 2011 in priority Korean patent application No. KR 10-2009-0013126, 4 pps.
(Continued)

*Primary Examiner* — Kyoung Lee
(74) *Attorney, Agent, or Firm* — Christie, Parker & Hale, LLP

(57) ABSTRACT

An organic light emitting diode (OLED) including: a substrate; a reflection layer on the substrate and including metal; a first electrode on the reflection layer and including a light transparent aluminum zinc oxide (AZO); an organic layer on the first electrode and including an emitting layer; and a second electrode on the organic layer and including a semi-transparent reflection layer.

14 Claims, 2 Drawing Sheets

U.S. PATENT DOCUMENTS

| | | | |
|---|---|---|---|
| 2005/0110023 A1* | 5/2005 | Lee et al. | 257/72 |
| 2006/0091791 A1 | 5/2006 | Shin | |
| 2006/0202614 A1* | 9/2006 | Li | 313/506 |
| 2008/0111484 A1 | 5/2008 | Kwon et al. | |
| 2008/0272690 A1 | 11/2008 | Kuma et al. | |
| 2009/0212696 A1* | 8/2009 | Terao | 313/506 |

FOREIGN PATENT DOCUMENTS

| | | |
|---|---|---|
| JP | 2006-121085 | 5/2006 |
| JP | 2007-317606 | 6/2007 |
| JP | 2008-205254 | 9/2008 |
| KR | 1020040103672 A | 12/2004 |
| KR | 1020060037857 A | 5/2006 |
| KR | 100787461 B1 | 12/2007 |

OTHER PUBLICATIONS

Japanese Office action dated Aug. 23, 2011 issued to corresponding Japanese Patent Application No. 2010-030031, listing the cited references in this IDS, 4 pages.

Japanese Office action dated Jan. 17, 2012, for corresponding Japanese Patent application 2010-30031, 2 pages.

* cited by examiner

ORGANIC LIGHT-EMITTING DIODE AND METHOD OF MANUFACTURING THE SAME

CROSS-REFERENCE TO RELATED PATENT APPLICATION

This application claims priority to and the benefit of Korean Patent Application No. 10-2009-0013126, filed on Feb. 17, 2009, in the Korean Intellectual Property Office, the entire content of which is incorporated herein by reference.

BACKGROUND OF THE INVENTION

1. Field of the Invention

The present invention relates to an organic light emitting diode (OLED) and a method of manufacturing the same.

2. Description of the Related Art

Organic light emitting diodes (OLEDs) are manufactured by sequentially stacking a first electrode as an anode, an organic emitting layer, and a second electrode as a cathode.

In a top emission type OLED structure in which light emitted from an organic emitting layer is transmitted through a second electrode to realize images, a first electrode is formed on a reflection layer using a metal oxide with a high work-function, and the second electrode is formed using a semi-transparent reflection type electrode. In addition, luminescence efficiency of light emitted toward the second electrode may further be increased by optical resonance occurring between the reflection layer and the second electrode in the top emission type OLED.

In this regard, if the thickness of the first electrode utilized as an anode is increased, the formation of faint (dim) spots may be reduced, and power consumption may be decreased.

In addition, in the top emission type OLED, light emitted from the organic emitting layer is transmitted through the anode due to resonance occurring between the reflection layer formed under the anode and the semi-transparent reflection layer utilized as a cathode. Thus, if an absorption constant k of the anode is increased, luminescence efficiency is reduced.

An indium tin oxide (ITO) layer, which has been used as an anode in conventional OLEDs, has a high absorption constant k, and an etching rate different from that of the reflection layer, and thus it is difficult to utilize it to form a thick anode.

SUMMARY OF THE INVENTION

An aspect of an embodiment of the present invention is directed toward an organic light emitting diode (OLED) having improved (or excellent) luminescence efficiency and reduced power consumption with an anode having sufficient thickness, and a method of manufacturing the same.

An embodiment of the present invention provides an organic light emitting diode (OLED) including: a substrate; a reflection layer on the substrate and including metal; a first electrode on the reflection layer and including a light transparent aluminum zinc oxide (AZO); an organic layer on the first electrode and including an emitting layer; and a second electrode on the organic layer and including a semi-transparent reflection layer.

The OLED may further include a thin film transistor on the substrate and electrically coupled to the reflection layer.

The OLED may further include a thin film transistor and a contact layer between the reflection layer and the substrate and including an AZO, and wherein the contact layer contacts the thin film transistor.

The organic layer may further include a first layer between the emitting layer and the first electrode, wherein a thickness of the first layer is in a range of about 40 nm to about 120 nm.

The first electrode may have a thickness in a range of about 30 nm to about 140 nm.

The light transparent AZO may have an absorption constant in a range of about $1\times10^{-3}$ to about $2\times10^{-2}$.

Another embodiment of the present invention provides a method of manufacturing an organic light emitting diode (OLED), the method including: forming a reflection layer including metal and on a substrate; forming a first electrode including a light transparent aluminum zinc oxide (AZO) and on the reflection layer; forming an organic layer including an emitting layer and on the first electrode; and forming a second electrode including a semi-transparent reflection layer and on the organic layer.

The forming of the first electrode may include: depositing an aluminum oxide on the reflection layer; and depositing a zinc oxide on the reflection layer.

The depositing of the aluminum oxide and the depositing of the zinc oxide may be concurrently performed.

The forming of the first electrode may include depositing the aluminum oxide and the zinc oxide in a weight ratio of between from about 1:99 and about 10:90.

The depositing of the aluminum oxide and the zinc oxide may be performed at a temperature ranging from about 100° C. to about 450° C.

The method may further include forming a thin film transistor on the substrate, wherein the reflection layer is electrically coupled to the thin film transistor.

The method may further include forming a contact layer comprising AZO to contact the thin film transistor before forming the reflection layer, wherein the reflection layer is on the contact layer.

The organic layer may further include a first layer between the emission layer and the first electrode, wherein the first layer has a thickness in a range of about 40 nm to about 120 nm.

The first electrode may have a thickness in a range of about 30 nm to about 140 nm.

The first electrode and the reflection layer may be concurrently patterned.

As such, in view of the foregoing and as described in more detail below, luminescence efficiency of an embodiment of the present invention is not decreased even though the first electrode formed on the reflection layer of a top emission structure is sufficiently thick.

In addition, power consumption may be decreased, and efficiency of the OLED may also be increased due to the sufficiently thick first electrode.

Furthermore, the resonance thickness between the reflection layer and the second electrode, as a semi-transparent reflection layer, may be controlled by the thickness of the first electrode instead of the first layer of the organic layer.

Productivity of the OLED may also be increased by concurrently (or simultaneously) patterning the sufficiently thick first electrode and the reflection layer.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION OF THE INVENTION

Figure 1:
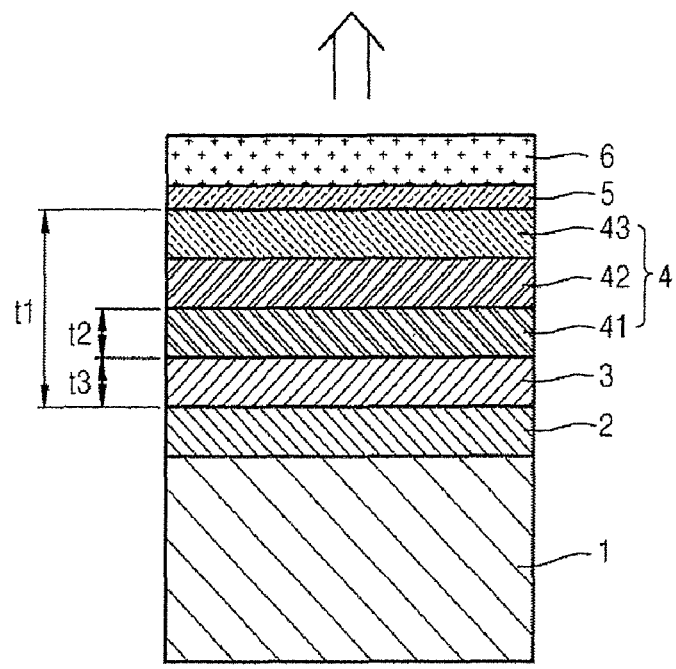
FIG. 1 is a schematic cross-sectional view of an organic light emitting diode (OLED) according to an embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

FIG. 1 is a schematic cross-sectional view of an organic light emitting diode (OLED) according to an embodiment of the present invention.

Referring to FIG. 1, an OLED according to an embodiment of the present invention includes a substrate 1, a reflection layer 2 formed on the substrate 1, a first electrode 3 formed on the reflection layer 2, an organic layer 4 formed on the first electrode 3, and a second electrode 5 formed on the organic layer 4.

The substrate 1 may be formed of glass, but material used to form the substrate 1 is not limited thereto. The substrate 1 may also be formed of plastic, metal, or the like. An insulating layer may also be formed on the substrate 1 (e.g., between the substrate 1 and the reflection layer 2) to planarize the surface of the substrate 1 and reduce or prevent the diffusion of impurities from the substrate 1. The substrate 1 may be transparent to light. However, the present invention is not limited thereto, and the substrate 1 may not be transparent to light.

The reflection layer 2 may be formed of a material having high light reflectance, such as metal. The thickness of the reflection layer 2 is determined such that light is sufficiently reflected.

The reflection layer 2 may be formed of Al, Ag, Cr, Mo, or the like, and may have a thickness of about 1,000 Å.

The first electrode 3 may be formed on the reflection layer 2 using a light transparent aluminum doped zinc oxide or aluminum zinc oxide (AZO). The first electrode 3 functions as an anode of the OLED.

The AZO is formed by mixing an aluminum oxide, e.g., $Al_2O_3$ and a zinc oxide, e.g., ZnO, in a specific ratio and depositing the mixture. The AZO is formed to be transparent to light.

The ratio of the aluminum oxide to the zinc oxide may be in the range of 1:99 to 10:90 (or about 1:99 to about 10:90).

The ratio of the aluminum oxide to the zinc oxide may be 2:98 (or about 2:98). If the portion of the aluminum oxide is less than 1 or greater than 10, resistance values may increase.

In addition, the aluminum oxide and the zinc oxide may be concurrently (or simultaneously) deposited by separate crucibles in a chamber to form the AZO layer at a temperature ranging from 100 to 450° C. (or about 100 to about 450° C.). In one embodiment, if the deposition temperature is less than 100° C., the quality of the AZO layer decreases, the transmittance decreases, and the absorption constant k increases. In one embodiment, if the deposition temperature is greater than 450° C., the substrate may be distorted.

The absorption constant of the AZO layer may be in the range of $1 \times 10^{-3}$ to $2 \times 10^{-2}$ (or about $1 \times 10^{-3}$ to about $2 \times 10^{-2}$). As the absorption constant k decreases, power consumption decreases, and thus luminescence efficiency for top emission increases.

Figure 2:
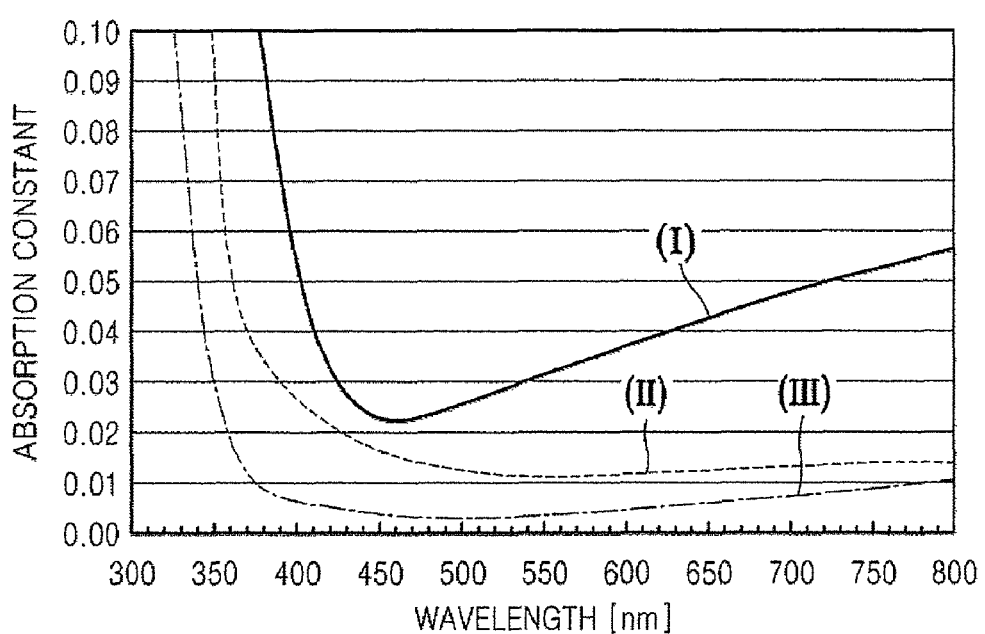
FIG. 2 is a graph illustrating absorption constants k of a first electrode according to embodiments of the present invention and absorption constant k of a conventional ITO layer with respect to wavelength.

FIG. 2 is a graph illustrating absorption constants k of AZO layers (II and III) according to embodiments of the present invention and absorption constant k of a conventional ITO (I) layer with respect to wavelength.

The curve II of FIG. 2 shows absorption constant k of the AZO layer when the aluminum oxide and the zinc oxide are deposited in the weight ratio of 2:98 at 200° C. The curve III of FIG. 2 shows absorption constant k of the AZO layer when the aluminum oxide and the zinc oxide are deposited in the weight ratio of 2:98 at 400° C. Based on the curve II, the AZO layer exhibits a low absorption constant ranging from 0.016 to 0.012 in a visible wavelength region ranging from 450 to 650 nm. Based on the curve III, the AZO layer exhibits an even lower absorption constant ranging from 0.002 to 0.006 in the visible wavelength region. Both AZO layers have far lower absorption constants than that of the ITO layer (I) ranging from 0.022 to 0.04 in the visible wavelength region.

As the absorption constant decreases by 10 times, power consumption decreases by about 10%. Thus, the absorption constant of the AZO layer deposited at 400° C. is less than that deposited at 200° C. It is difficult to reduce the absorption constant to be less than $1 \times 10^{-3}$.

Since the AZO layer is more quickly etched than the ITO layer used as a conventional anode, it is easier to concurrently (or simultaneously) pattern the AZO layer and the reflection layer 2. That is, when the ITO layer has a thickness of 200 Å (or about 200 Å), it is difficult to concurrently (or simultaneously) etch the ITO layer and the reflection layer 2 formed using Ag. However, since the AZO layer having a thickness of greater than 1000 Å (or about 1000 Å) has a high etching rate, it is easy to concurrently (or simultaneously) etch AZO layer and the reflection layer 2 formed using Ag. Thus, the first electrode 3 may have a sufficient thickness, i.e., in the range of 30 to 140 nm (or about 30 to about 140 nm), and therefore power consumption may be reduced, and a resonance thickness, which is a distance t1 between the reflection layer 2 and the second electrode 5, may be satisfied. Conventionally, a supporting layer has been formed on the organic layer in order to satisfy the resonance thickness. However, here such an extra supporting layer is not needed.

The organic layer 4 includes an emitting layer 42.

A first layer 41, as a common functional layer, is interposed between the emitting layer 42 and the first electrode 3.

The first layer 41 may be formed by stacking both a hole injection layer (HIL) and a hole transport layer (HTL) or selectively stacking one of the HIL and the HTL.

The HIL may be formed using thermal evaporation or spin coating of a material that is used to form the HIL.

The material used to form the HIL may be a phthalocyanine compound, such as copperphthalocyanine, or a star-burst type amine derivative, such as TCTA, m-MTDATA, and m-MT-DAPB.

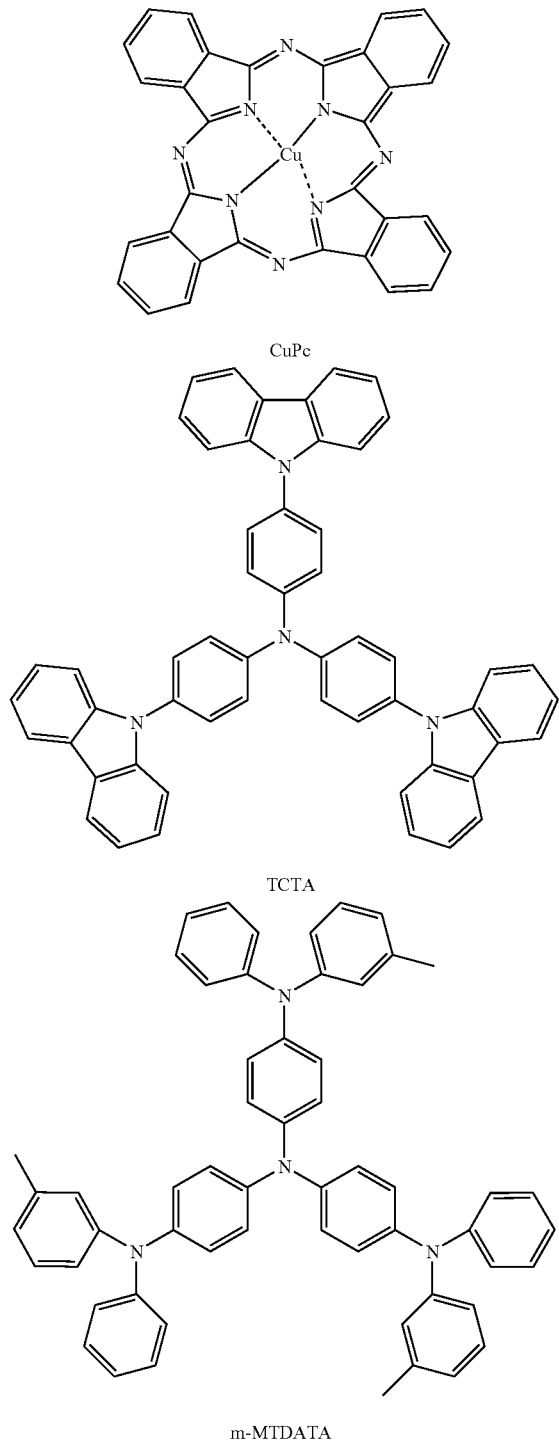

The HTL may be formed on the HIL by vacuum deposition, spin coating, casting, Langmuir Blodgett (LB), or the like using a material that is used to form the HTL. The HTL may be formed by vacuum deposition to obtain a uniform layer and to reduce or prevent the formation of pin holes. When the HTL is formed by vacuum deposition, vacuum deposition conditions may vary according to the material that is used to form the HTL. In general, however, the conditions for vacuum deposition are similar to those for the formation of the HIL.

The material used to form the HTL may be N,N'-bis(3-methylphenyl)-N,N'-diphenyl-[1,1-biphenyl]-4,4'-diamine (TPD), and N,N'-di(naphthalene-1-yl)-N,N'-diphenyl benzydine (α-NPD), but is not limited thereto.

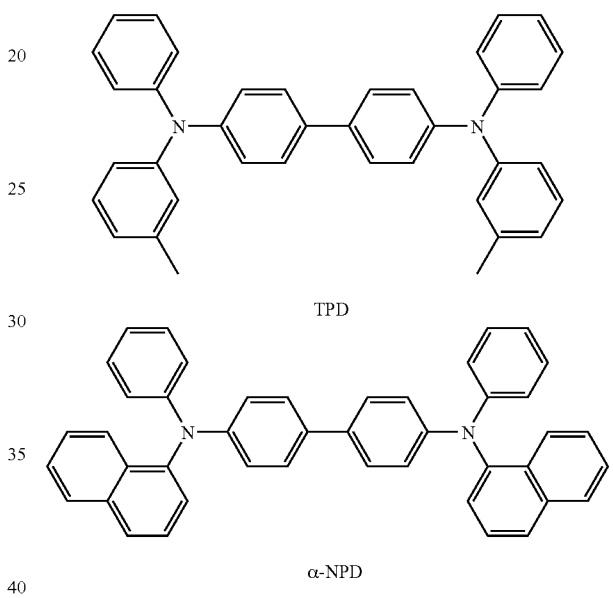

Then, an emitting layer 42 is formed on the first layer 41, and a second layer 43, as another common functional layer, is formed on the emitting layer 42.

The second layer 43 may be formed by stacking both an electron injection layer (EIL) and an electron transport layer (ETL) or selectively stacking one of the EIL and the ETL.

The EIL may be formed of LiF, NaCl, CsF, Li2O, BaO, Liq, or the like. The thickness of the EIL may be in the range of 1 to 100 Å (or about 1 to about 100 Å), but is not limited thereto.

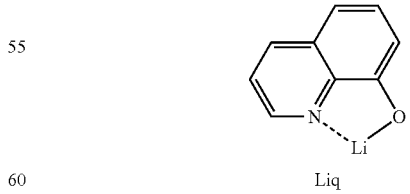

The ETL may be formed using vacuum deposition or spin coating. A material that is used to form the ETL may be Alq3, but is not limited thereto. The thickness of the ETL may be in the range of 50 to 600 Å (or about 50 to about 600 Å), but may vary according to the material used to form other layers.

A hole blocking layer (HBL) may be selectively interposed between the organic emitting layer 42 and the second layer 43, or between the EIL and the ETL of the second layer 43 using a material for blocking holes. The material used to form the HBL has high electron transporting capability and higher ionization potential than an emitting compound. The material used to form the HBL may be Balq, BCP, and TPBI, but is not limited thereto.

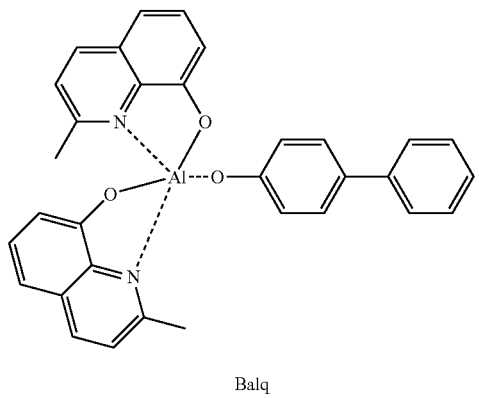

Balq

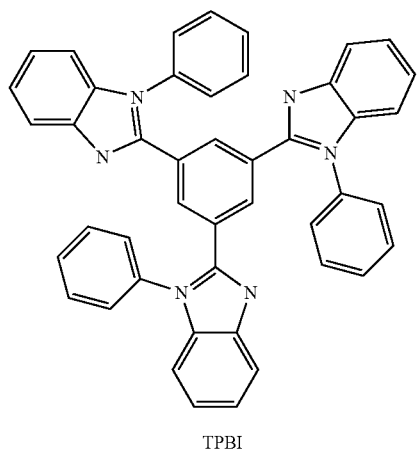

TPBI

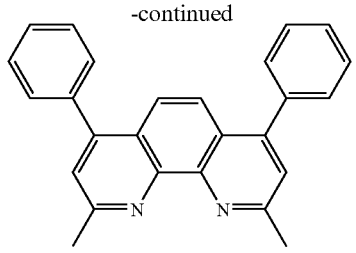

BCP

The emitting layer 42 may be formed of a mixture of a host material and a dopant material, or may be independently formed of the host material or the dopant material.

The host material may be tris(8-hydroxy-quinolinorate) aluminum (Alq3), 9,10-di(naphth-2-yl)anthracene (AND), 3-tert-butyl-9,10-di(naphth-2-yl)anthracene (TBADN), 4,4'-bis(2,2-diphenyl-ethene-1-yl)-4,4'-dimethylphenyl (DPVBi), 4,4'-bis(2,2-diphenyl-ethene-1-yl)-4,4'-dimethylphenyl (p-DMDPVBi), tert(9,9-diarylfluorene)s (TDAF), 2-(9,9'-spirobifluorene-2-yl)-9,9'-spirobifluorene (BSDF), 2,7-bis(9,9'-spirobifluorene-2-yl)-9,9'-spirobifluorene (TSDF), bis(9,9-diarylfluorene)s (BDAF), 4,4'-bis(2,2-diphenyl-ethene-1-yl)-4,4'-di-(tert-butyl)phenyl (p-TD-PVBi), 1,3-bis(carbazole-9-yl)benzene (mCP), 1,3,5-tris(carbazole-9-yl)benzene (tCP), 4,4',4''-tris(carbazole-9-yl)triphenylamine (TcTa), 4,4'-bis(carbazole-9-yl)biphenyl (CBP), 4,4'-bis(9-carbazolyl)-2,2'-dimethyl-biphenyl (CBDP), 4,4'-bis(carbazole-9-yl)-9,9-dimethyl-fluorene (DMFL-CBP), 4,4'-bis(carbazole-9-yl)-9,9-bis(9-phenyl-9H-carbazole)fluorene (FL-4CBP), 4,4'-bis(carbazole-9-yl)-9,9-di-tolyl-fluorene (DPFL-CBP), 9,9-bis(9-phenyl-9H-carbazole)fluorene (FL-2CBP), or the like.

The dopant material may be 4,4'-bis[4-(di-p-tolylamino)styryl]biphenyl (DPAVBi), 9,10-di(naph-2-thyl)anthracene (ADN), 3-tert-butyl-9,10-di(naph-2-thyl)anthracene (TBADN), or the like.

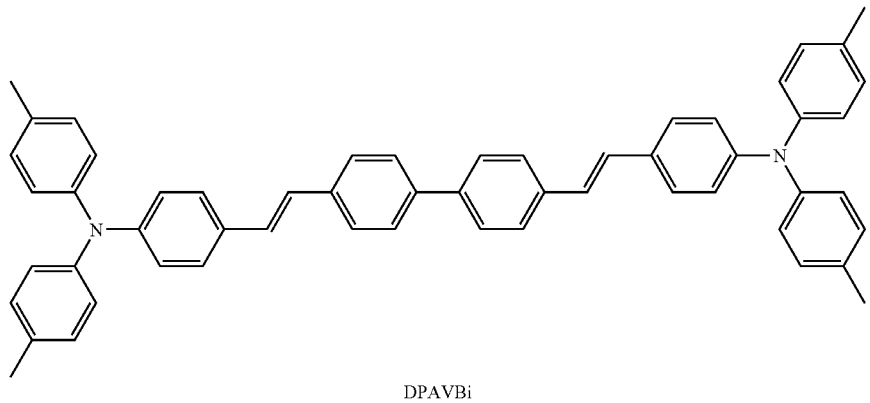

DPAVBi

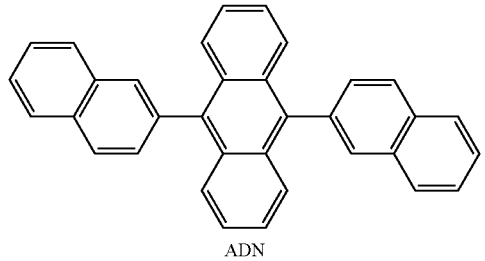

ADN

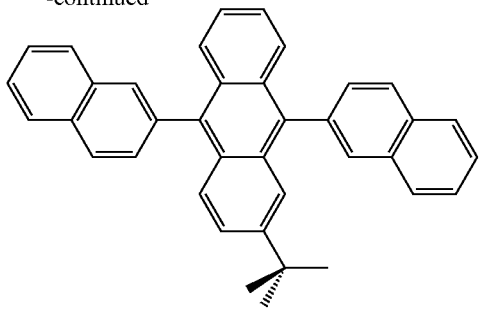

TBADN

After forming the organic layer 4, a second electrode 5 is formed on the organic layer 4.

The second electrode 5 is formed using a low work-function metal. A semi-transparent reflection may be performed by reducing the thickness. A Mg:Ag thin layer may have a thickness ranging from 100 to 300 Å (or about 100 to about 300 Å). Low work-function metal, such as Al, Au, and Cr, may also be used.

After forming the second electrode 5, a capping layer 6 may be formed on the second electrode 5. The capping layer 6 may be formed of a transparent organic or inorganic material for light transmission.

Light coupling efficiency may be increased due to optical resonance by adjusting a distance t1 between the reflection layer 2 and the second electrode 5, which face each other, to an emission wavelength of the emitting layer 42.

Since it is difficult for the first electrode 3 to have a sufficient thickness t3 in a conventional OLED, the thickness t2 of the first layer 41 needs to be increased in order to meet the resonance distance t1. In the conventional OLED, the thickness t3 of the first electrode 3 is equal to or greater than 1000 Å.

However, according to an embodiment of the present invention, since the AZO is used as the first electrode 3, the thickness t3 of the first electrode 3 may be sufficiently thick, e.g. ranging from 30 to 140 nm (or about 30 to about 140 nm), and thus the thickness t2 of the first layer 41 of the organic layer 4 can be decreased. According to an embodiment of the present invention, the thickness t2 of the first layer 41 is in the range of 40 to 120 nm (or about 40 to about 120 nm). As the thickness of the organic layer 4 decreases by increasing the thickness of the AZO electrode, driving voltage decreases, and power consumption decreases.

Figure 3:
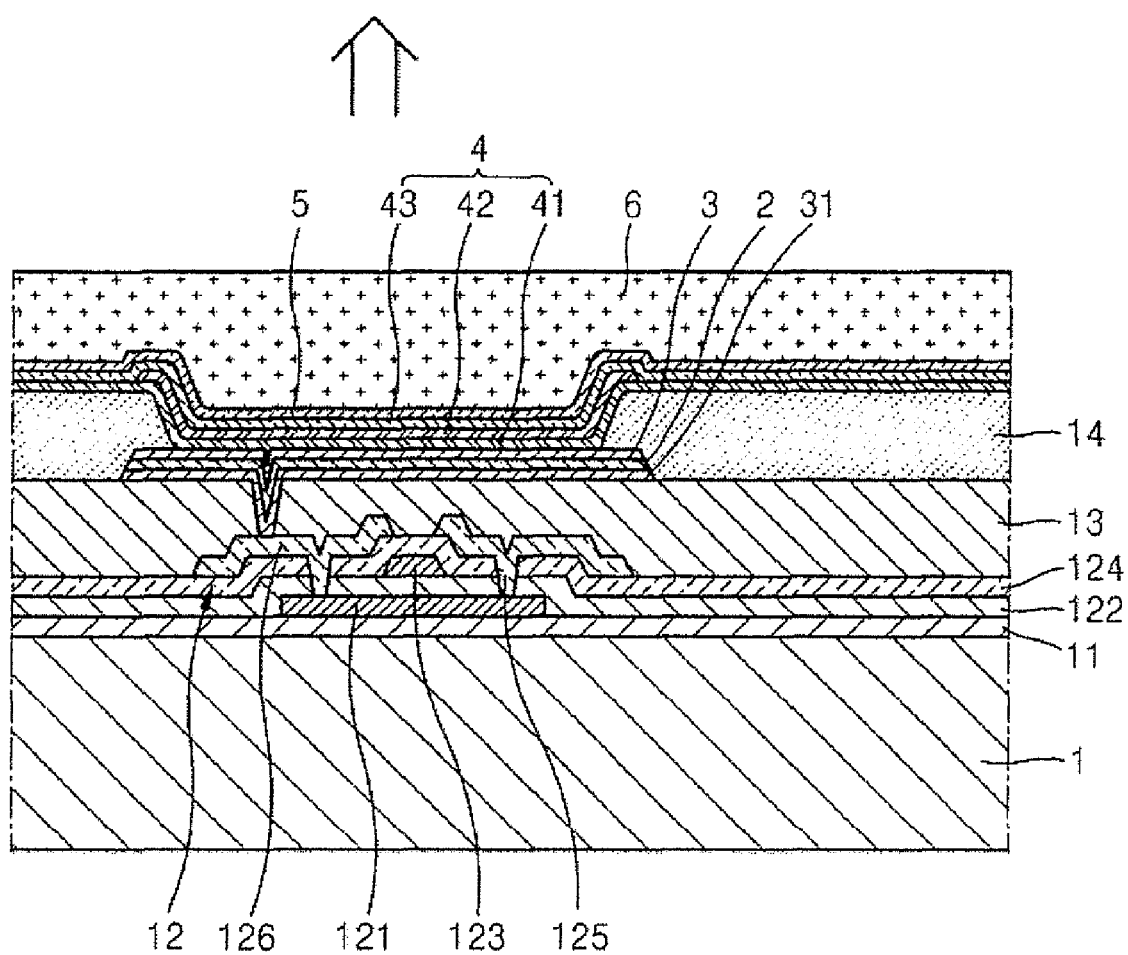
FIG. 3 is a schematic cross-sectional view of an OLED according to another embodiment.

FIG. 3 is a schematic cross-sectional view of an OLED according to another embodiment of the present invention, e.g., a top emission active matrix OLED.

A buffer layer 11 is formed on a substrate 1, and a pixel circuit including a thin film transistor 12 is formed on the buffer layer 11. The pixel circuit may further include a capacitor in addition to the thin film transistor 12, even though FIG. 3 illustrates only the thin film transistor 12 as an element constituting the pixel circuit.

The thin film transistor 12 formed on the buffer layer 11 may be fabricated as follows. First, an activation layer 121 is formed on the buffer layer 11 using a semiconductor material. A gate insulating layer 122 is formed to cover the activation layer 121, and a gate electrode 123 is formed on the gate insulating layer 122. An inter-layered insulating layer 124 is formed on the gate insulating layer 122 to cover the gate electrode 123. A source electrode 125 and a drain electrode 126, which are in contact with the activation layer 121, are formed on the inter-layered insulating layer 124.

A planarization layer 13 is formed to cover the thin film transistor 12, and a contact layer 31, which is in contact with the drain electrode 126 of the thin film transistor 12, is formed on the planarization layer 13. The contact layer 31 may be formed using a material that is the same as that used to form the AZO layer of the first electrode 3 and formed to have a thickness ranging from 50 to 150 Å (or about 50 to about 150 Å). In one embodiment, if the thickness of the contact layer 31 is too large, the contact resistance between the drain electrode 126 and the reflection layer 2 is too high. On the other hand, if the thickness of the contact layer 31 is too small, Ohmic contact may not be formed.

The reflection layer 2 is formed on the contact layer 31, and the first electrode 3 is formed on the reflection layer 2.

As shown in FIG. 3, the contact layer 31, the reflection layer 2, and the first electrode 3 may be formed by sequentially stacking an AZO film, an Ag film, and an AZO film, and concurrently (or simultaneously) patterning the films. As described above, since the contact layer 31 and the first electrode 3 are formed of the AZO film, etching can be quickly performed, i.e., can be quickly etched, and thus the contact layer 31 and the first electrode 3 may be concurrently (or simultaneously) etched with the reflection layer 2.

After forming the first electrode 3, a pixel defining layer 14 is formed using an insulating material. The pixel defining layer 14 is formed on the planarization layer 13 to cover edges (or edge portions) of the first electrode 3.

Then, a first layer 41, an emitting layer 42, and a second layer 43 are sequentially stacked on the first electrode 3 to form an organic layer 4. In this regard, the first layer 41 and the second layer 43 may be formed as a common layer over the pixels, and the emitting layer 42 may be independently patterned on each of the pixels.

Then, a second electrode 5, as a semi-transparent reflection layer, is formed on the organic layer 4 so as to cover the pixels.

A capping layer 6 may further be formed on the second electrode 5.

While the present invention has been described in connection with certain exemplary embodiments, it is to be understood that the invention is not limited to the disclosed embodiments, but, on the contrary, is intended to cover various modifications and equivalent arrangements thereof.

What is claimed is:
1. An organic light emitting diode (OLED) comprising:
    a substrate;
    a first reflection layer on the substrate and comprising metal;

a first electrode on the first reflection layer and comprising a light transparent aluminum zinc oxide (AZO);

an organic layer on the first electrode and comprising an emitting layer;

a second electrode on the organic layer and comprising a semi-transparent reflection layer; and a thin film transistor on the substrate and electrically coupled to the first reflection layer.

2. The OLED of claim 1, wherein the organic layer further comprises a first layer between the emitting layer and the first electrode, wherein a thickness of the first layer is in a range of about 40 nm to about 120 nm.

3. The OLED of claim 1, wherein the first electrode has a thickness in a range of about 30 nm to about 140 nm.

4. The OLED of claim 1, wherein the light transparent AZO has an absorption constant in a range of about $1 \times 10^{-3}$ to about $2 \times 10^{-2}$.

5. An organic light emitting diode (OLED) comprising:
a substrate;
a first reflection layer on the substrate and comprising metal;
a first electrode on the first reflection layer and comprising a light transparent aluminum zinc oxide (AZO);
an organic layer on the first electrode and comprising an emitting layer;
a second electrode on the organic layer and comprising a semi-transparent reflection layer; and
a thin film transistor and a contact layer between the first reflection layer and the substrate and comprising an AZO, wherein the contact layer contacts the thin film transistor.

6. A method of manufacturing an organic light emitting diode (OLED), the method comprising:
forming a first reflection layer comprising metal and on a substrate;
forming a first electrode comprising a light transparent aluminum zinc oxide (AZO) and on the first reflection layer, wherein the first electrode is formed by depositing an aluminum oxide on the first reflection layer and depositing a zinc oxide on the first reflection layer;
forming an organic layer comprising an emitting layer and on the first electrode; and
forming a second electrode comprising a semi-transparent reflection layer and on the organic layer.

7. The method of claim 6, wherein the depositing of the aluminum oxide and the depositing of the zinc oxide are concurrently performed.

8. The method of claim 6, wherein the forming of the first electrode comprises depositing the aluminum oxide and the zinc oxide in a weight ratio of between from about 1:99 and about 10:90.

9. The method of claim 6, wherein the depositing of the aluminum oxide and the zinc oxide are performed at a temperature ranging from about 100° C. to about 450° C.

10. The method of claim 6, further comprising forming a thin film transistor on the substrate, wherein the first reflection layer is electrically coupled to the thin film transistor.

11. The method of claim 10, further comprising forming a contact layer comprising AZO to contact the thin film transistor before forming the first reflection layer, wherein the first reflection layer is on the contact layer.

12. The method of claim 6, wherein the organic layer further comprises a first layer between the emitting layer and the first electrode, wherein the first layer has a thickness in a range of about 40 nm to about 120 nm.

13. The method of claim 6, wherein the first electrode has a thickness in a range of about 30 nm to about 140 nm.

14. The method of claim 6, wherein the first electrode and the first reflection layer are concurrently patterned.

* * * * *